(12) United States Patent
Huovila et al.

(10) Patent No.: US 12,346,636 B2
(45) Date of Patent: Jul. 1, 2025

(54) COMPUTER AIDED MODELING AND INTERACTIONS WITH DIFFERENT MODELS

(71) Applicant: Trimble Solutions Corporation, Espoo (FI)

(72) Inventors: Mikko Huovila, Espoo (FI); Tapio Kohonen, Espoo (FI); Petri Heinonen, Espoo (FI); David Bartliff, Espoo (FI)

(73) Assignee: Trimble Solutions Corporation, Espoo (FI)

( * ) Notice: Subject to any disclaimer, the term of this patent is extended or adjusted under 35 U.S.C. 154(b) by 886 days.

(21) Appl. No.: 17/404,065

(22) Filed: Aug. 17, 2021

(65) Prior Publication Data

US 2022/0058301 A1    Feb. 24, 2022

(30) Foreign Application Priority Data

Aug. 18, 2020   (FI) .................................. 20205804

(51) Int. Cl.
    *G06F 30/13*    (2020.01)
    *G06F 30/12*    (2020.01)

(52) U.S. Cl.
    CPC .............. *G06F 30/13* (2020.01); *G06F 30/12* (2020.01)

(58) Field of Classification Search
    CPC .................................. G06F 30/12; G06F 30/13
    USPC ............................................................. 703/1
    See application file for complete search history.

(56) References Cited

U.S. PATENT DOCUMENTS

| | | | |
|---|---|---|---|
| 8,001,552 B1 | 8/2011 | Chickneas | |
| 8,131,754 B1* | 3/2012 | Lawrence | G06F 16/951 |
| | | | 707/758 |
| 10,748,092 B2* | 8/2020 | Levermore | G06Q 10/06 |
| 2007/0174027 A1 | 7/2007 | Moiseyev | |
| 2007/0179759 A1 | 8/2007 | Mangon | |
| 2009/0060347 A1 | 3/2009 | Kageura | |
| 2020/0043238 A1* | 2/2020 | Rasane | G06T 19/006 |

OTHER PUBLICATIONS

Interpretation of structural analytical models from the coordination view in building information models, 17 pages. (Year: 2018).*
Finnish Patent Search Report for Application No. 20205804, dated Jan. 21, 2021, 2 pages.
Finnish Office Action for Application No. 20205804, dated Jan. 21, 2021, 7 pages.

* cited by examiner

*Primary Examiner* — Andre Pierre Louis
(74) *Attorney, Agent, or Firm* — Kilpatrick Townsend & Stockton LLP

(57) ABSTRACT

A digital model of a structure comprises a physical BIM model and one or more analysis models for structural engineering, wherein a piece of the structure may have one digital representation, called a physical part, in the physical BIM model, and one digital representation, called an analysis part, in one of the analysis models, but there may be analysis parts without corresponding physical parts, and vice versa. Association information associating an analysis part with a corresponding physical part allows a soft relation between the parts, the soft relation being usable for indicating that a part's corresponding part has changed without changing the part correspondingly.

9 Claims, 6 Drawing Sheets

COMPUTER AIDED MODELING AND INTERACTIONS WITH DIFFERENT MODELS

REFERENCE TO RELATED APPLICATIONS

This application claims priority to Finnish Patent Application No. 20205804, filed Aug. 18, 2020, the contents of which are incorporated herein by reference in their entirety.

FIELD

The present invention relates generally to computer aided modeling of structures and especially to different models of a structure and interactions between them.

BACKGROUND ART

The development of data processing systems, computer and computer applications has transformed different processes into computerized processes. For example, there are computer applications for creating digital representations of different structures, like buildings. Such digital representations are called herein digital physical models. Many of the computational tools used in engineering for structural analysis also use digital representations of the structures, the digital representations being based on digital physical models. Such digital representations are called herein digital analysis models.

SUMMARY

The invention relates to a method, an apparatus, a system, a program product and a computer-readable storage medium which are characterized by what is stated in the independent claims. Other embodiments are disclosed in the dependent claims.

An aspect provides an association between a digital physical part and a digital analysis part, and by means of the associations a change in the digital physical part can be indicated in the digital analysis model and vice versa.

BRIEF DESCRIPTION OF THE DRAWINGS

In the following different embodiments of the invention will be described in greater detail with reference to the attached drawings, in which.

DETAILED DESCRIPTION OF SOME EXAMPLES

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

The present invention is applicable to any computer-aided modeling, and corresponding modeling applications (i.e. modeling programs), or any other system/applications configured or configurable to process analysis models of structures based on digital physical models of structures and/or to process digital physical models of structures. Examples of such applications are computer aided design applications and computer aided modeling applications, such as different Building Information Modeling (BIM) applications. A BIM model, created using a BIM application, provides a digital representation of physical and functional characteristics of a structure. In other words, a BIM model is a shared knowledge resource for information about the facility (building) forming a reliable basis for decisions during its life-cycle. Current BIM applications are used to plan, design, construct, operate and maintain diverse physical infrastructures, such as water, refuse, electricity, gas, communication utilities, roads, bridges, ports, tunnels, different buildings, etc.

Below different examples are explained without tying them to a specific application. It should be appreciated that various programming techniques, storage of data in memory and manners of modeling real world articles and implementing databases develop constantly. This may require extra changes in the invention. Consequently, all terms and expressions should be interpreted broadly, and they are intended to describe, not to restrict, the invention.

Figure 1:
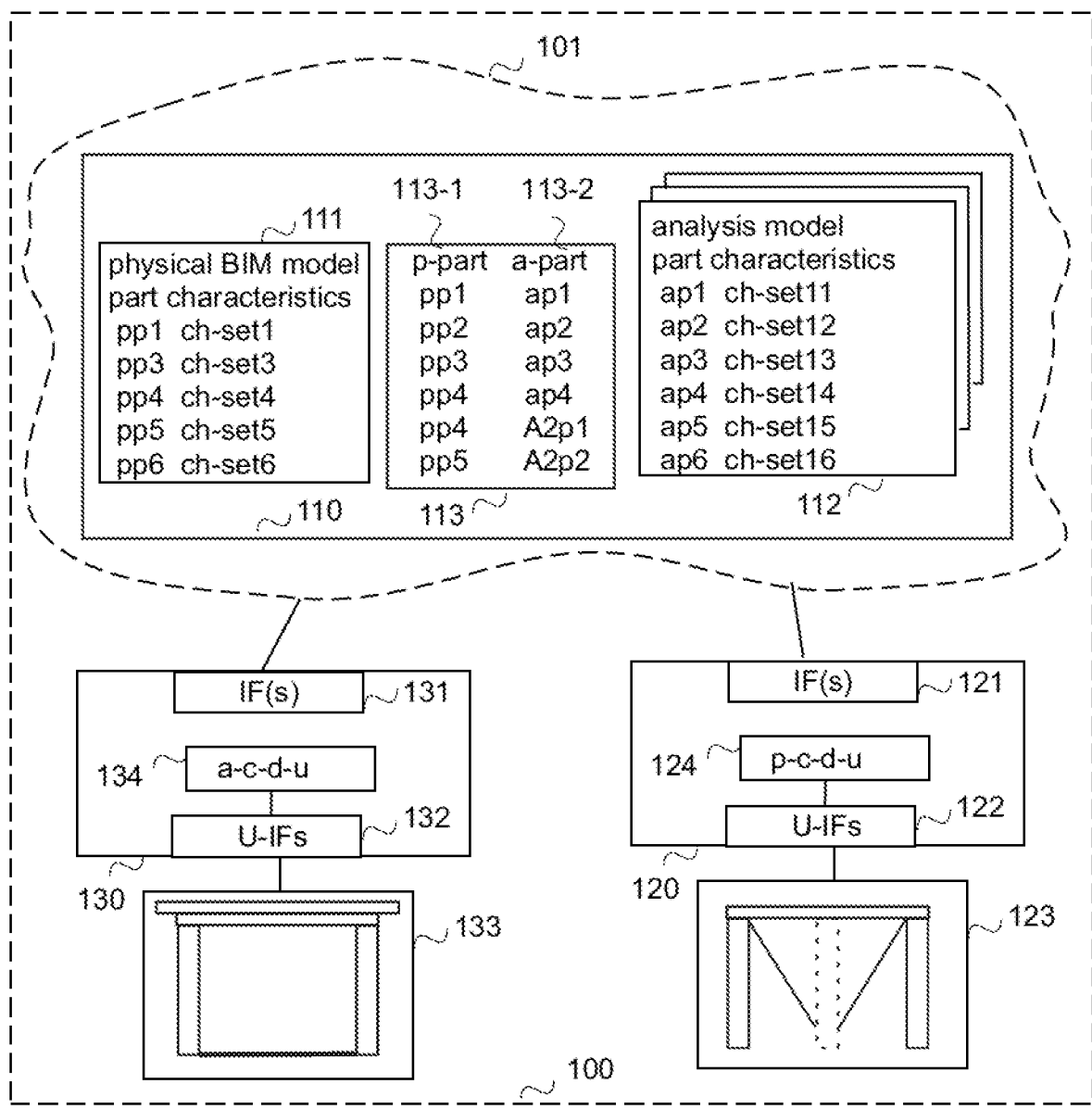
FIG. 1 is a schematic diagram depicting basic concepts and schematic block diagrams of apparatuses.

FIG. 1 illustrates a simplified system describing only some logical units with their operative connections, the implementation of which may deviate from what is presented. It is obvious to a person skilled in the art that the system may also comprise other functions and structures that need not be described in greater detail here. The more detailed structure of the system is irrelevant to the actual invention. Further, the basic concepts depicted in FIG. 1 on a generalized level use extremely simple examples of models for a structure, only for illustrative purposes, without limiting the concept thereto.

The simplified modeling system 100 illustrated in Figure comprises one or more data storages 101, one or more apparatuses 120 (one is shown in FIG. 1) configured to process at least digital analysis models and one or more apparatuses 130 (one is shown in FIG. 1) configured to process at least digital physical BIM models, the apparatuses being connectable to the one or more data storages 101. Naturally, although not illustrated, there may be apparatuses configured to process both digital analysis models and digital physical BIM models.

The data storage 101 stores, for a digital model 110 of a structure, its digital physical BIM model 111, called below simply physical BIM model, and one or more digital analysis models, called below simply analysis models 112. The data storage 101 may be any kind of conventional or future data repository, including distributed and centralized storing of data, managed by any suitable management system forming part of the modeling system (modeling environment). An example of distributed storing includes a cloud-based storage in a cloud environment (which may be a public cloud, a community cloud, a private cloud, or a hybrid cloud, for example). Cloud storage services may be accessed through a co-located cloud computer service, a web service application programming interface (API) or by applications that utilize API, such as cloud desktop storage, a cloud storage gateway or Web-based content management systems. Further, the modeling system 100 may comprise several servers with databases, which may be integrated to be visible to the user (user apparatus) as one database and one database server. However, the implementation of the data storage, the manner how data is stored, retrieved and updated, and the location where different pieces of data are stored are irrelevant to the invention.

The digital model 110 of a structure, such as a building, comprises one or more models, a model comprising one or more objects that represent real-world articles (pieces) forming the modelled structure, and/or used during fabrication of the modelled structure. It should be appreciated that herein "article" means an item that will or may exist in the real world or at least is planned to exist in the real world. An example of an article is a construction item. Further, it should be appreciated that the term "article" used herein means, in addition to one or more single pieces/items/elements, one or more parts, one or more assemblies including subassemblies, one or more structures forming a further structure, and one or more connections with their articles, like bolt(s), weld(s) or reinforcement splices(s).

In 3D models, an article is modeled as a 3D object 110. The definitions of an object define at least geometrical properties of the object and its location in the model (location in 3D coordination system which is a global coordination system within the model). Typically an object is given its creation point or points, the amount of creation points depending on the article to be modeled and the modeling application/analysis application used, and values for different parameters representing the physical values of the article. Examples of creation points include a starting point and an ending point of the object, or creation points defining outlines of the objects. A plurality of properties can be associated with each object that can detail, in addition to the location and geometry of the object, the manner of connectivity of the object to other objects, materials used to, or to be used to, realize the object, such as concrete, wood, steel, and other suitable properties. The definitions and properties are called herein as characteristics. Further, usually each object has an identifier (ID), which is part of the object's model data. A non-limiting example of such an identifier is a globally unique identifier (GUID). The identifier, or part of it, may be automatically created by the modeling application, or obtained as user input.

Below term "part" is used for objects (model objects) representing articles for the sake of clarity.

The models comprised in the digital model 110 of a structure include one physical BIM model 111 of the structure and one or more analysis models 112 for the structure.

The physical BIM model 111 comprises structure data, i.e. definitions for physical parts. The definitions of a physical part comprise its identifier and characteristics, for example dimensions and general material information. Further, the characteristics may comprise information indicating when the part will be, or has been, manufactured, for example. It should be appreciated that although the physical BIM model 111 is depicted as one entity, it may comprise sub-models that together form the physical BIM model.

An analysis model 112 comprises analysis engineering data, including definitions for analysis parts, and it is used for structural engineering. It should be appreciated that the term structural engineering covers herein also structural analysis. The analysis model may be called a structural analysis model, or a structural BIM analysis model, or a BIM analysis model, or a structural engineering model, or an engineering model, or a structural BIM engineering model, or a BIM engineering model. The definitions of an analysis part comprise its identifier and characteristics, for example mechanical properties of materials and cross-sections. There may be one or more alternative analysis models, and/or an analysis model may comprise one or more prospective parts. A prospective part is a part the engineer is still thinking about, i.e. has not made a final decision, whether it is needed as a permanent part for load bearing purposes, for example, or as a temporary part for fabrication, or whether any of its characteristics should be changed, or should the part be deleted from the model. Hence, the characteristics may comprise information indicating whether a status is "not yet decided", "final", etc.

The digital model 110 of the structure comprises also association information 113. The association information 113 comprises one or more associations. An association associates a physical part to a corresponding analysis part in an analysis model, and vice versa. It should be appreciated that the characteristics of the physical part and the characteristics of the corresponding (associated) analysis part may be different, i.e. they need not to be identical. The association contains an identifier 113-1 of the physical part in the physical BIM model 111 and an identifier 113-2 of the analysis part in the analysis model 112. Since a physical part may have a plurality of corresponding analysis parts in a plurality of analysis models, the identifier of the physical part may be in the association information 113 more than once, when the association information is stored in a form of identifier pairs, as in FIG. 1. If the association information 113-1 is stored so that an identifier of a physical part is stored only once, then a field for identifiers 113-2 of analysis parts may comprise one or more analysis part identifiers. Naturally, if a physical part does not have any corresponding analysis part, the identifier of the physical part is not in the association information (or is associated with an empty field.

It should be appreciated that the illustrated way to store the association information is just an example, and any other way may be used. For example, the association information may be stored as part of the analysis model and/or as part of the physical BIM model.

The physical BIM model 111 and/or the one or more analysis models 112 and/or the association information 113 may be stored as shared data.

The apparatus 120 configured to process at least analysis models may be any computing device that can be configured to perform at least part of functionalities described below. For that purpose, i.e. to support the analysis model association related functionality, the apparatus 120 comprises a unit 124, called herein a physical part correspondence detection unit (p-c-d-u). The physical part correspondence detection unit 124 may be part of an analysis application, or an add-in or a plug-in to the analysis application. The apparatus 120 further comprises one or more interfaces (IFs) 121 towards the modeling system and the database and one or more user interfaces (U-IFs) 122. The user may, depending on the capabilities and application in use, create a model, modify a model, study it, perform required calculations for structural engineering, output (display, print) desired technical documents, view the model, input information, including different selections, etc. by using the one or more user interfaces 122. For example, one of the interfaces 122 may be a display interface via which models and/or technical documents may be shown on a display screen 123. A non-limiting list of examples of apparatuses 120 includes a user terminal or a workstation, such as a laptop, a smartphone, a personal computer, a tablet computer, a field device, a virtual reality device, augmented reality (AR) interface device, a web client, or a server, like a cloud server or a grid server.

The apparatus 130 configured to process at least digital physical BIM models may be any computing device that can be configured to perform at least part of functionalities described below. For that purpose, i.e. to support physical BIM model association related functionality, the apparatus 130 comprises a unit 134, called herein an analysis part correspondence detection unit (a-c-d-u). The analysis part correspondence detection unit 134 may be part of a modeling application, or an add-in or a plug-in to the modeling application. The apparatus 130 further comprises one or more interfaces (IFs) 131 towards the modeling system and the database and one or more user interfaces (U-IFs) 132. The user may, depending on the capabilities and application in use, create a model, modify a model, study it, output (display, print) desired technical documents, such as the engineering drawings, and/or reports of the model, view the model, input information, including different selections, etc. by using the one or more user interfaces 132. For example, one of the user interfaces 132 may be a display interface via which models may be shown on a display screen 133. A non-limiting list of examples of apparatuses 130 includes a user terminal or a workstation, such as a laptop, a smartphone, a personal computer, a tablet computer, a field device, a virtual reality device, augmented reality (AR) interface device, a web client, or a server, like a cloud server or a grid server.

Below term "modeling tool" means the application/feature used in creating and manipulating the physical BIM model, "modeler" means a user of the modeling tool, term "analysis tool" means the application/feature used in creating and manipulating the analysis models for structural engineering, and "engineer" means a user of the analysis tool, just for the sake of clarity, without restricting the examples to such combinations. The user of the modeling tool may be called also technician, or a technical expert, or a BIM technician. It should be appreciated that the same person could have both user roles, i.e. be the engineer and the modeler. Further, the modeling tool and the analysis tool may be different features within the same application. In other words, the difference between the physical BIM model, modeling tool, modeler and analysis model, analysis tool, engineer, used herein may be a mere logical difference or also a physical difference in the 805 real world.

The example of FIG. 1 illustrates a snapshot of the system in a hypothetical situation after certain events. The events preceding the snapshot include following events. The modeler has created a physical BIM model comprising three columns (pp1, pp2, pp3), a beam (pp4) above the columns, a slab (pp5) above the beam and a bottom part (pp6), and stored it to the database. Then the engineer created, based on the physical BIM model, two analysis models for the structure and stored the analysis models to the database. A first analysis model (details of which are illustrated in FIG. 1) comprises three columns (ap1, apt, ap3) corresponding to the three columns (pp1, pp2, pp3) in the physical BIM model, a beam (ap4) corresponding to the beam (pp4) in the physical BIM model and two diagonal supports (ap5, ap6) not having counterparts in the physical BIM model. A second analysis model comprises a beam (A2$p$1) corresponding to the beam (pp4) in the physical BIM model and a slab (A2$p$2) corresponding to the slab (pp5) in the physical BIM model. The modeler then manipulates the physical BIM model by removing the middlemost column (pp2), stores the result as the physical BIM model while still watching the result on the display screen 133. After that the engineer wants to review the first analysis model, and the first analysis model is displayed on the display screen 123.

The snapshot contains for the physical BIM model definitions (characteristics) of physical parts, i.e. ch-set1, ch-set2 as definitions (characteristics) of the two columns, identified by pp1 and pp3, ch-set-4 as definitions (characteristics) of the beam, identified by pp4, ch-set 5 as definitions (characteristics) of the slab, identified by pp5, and ch-set 6 as definitions (characteristics) of the bottom part, identified by pp6. The associating information associates the physical part pp1 to the analysis part ap1 (column in the first analysis model), the physical part pp3 to the analysis part ap3 (column in the first analysis model), the physical part pp4 both to the analysis part ap4 (beam in the first analysis model) and the analysis part A2$p$1 (beam in the second analysis model), and the physical part pp5 to the analysis part A2$p$2 (slab in the second analysis model), whereas the physical part pp6 has no association.

The snapshot contains for the first analysis model definitions (characteristics) of analysis parts, i.e. ch-set11, ch-set12, and ch-set13 as definitions (characteristics) of the three columns, identified by ap1, ap2 and ap3, ch-set14 as definitions (characteristics) of the beam, identified by ap4, and ch-set15 and ch-set 16 as definitions (characteristics) of the diagonal supports, identified by ap5 and ap6. The associating information associates the analysis part ap1 to the physical part pp1 (column in the physical BIM model), the analysis part ap2 to the physical part pp1 (middlemost column in the original physical BIM model), the analysis part ap3 to the physical part pp3 (column in the physical BIM model), the analysis part ap4 to the physical part pp4 (beam in the physical BIM model), whereas the analysis parts ap5 and ap6 have no association. Since the middlemost column in the original physical BIM model was deleted, thanks to the association existing in the association information, the deletion is noticed by the analysis tool, as will be described in more detail below, and the analysis part 2 is indicated as deleted, shown by dashed lines. Therefore the engineer immediately detects that there is a change that requires his/her attention, technical considerations and possibly a decision whether to re-perform the structural analysis (structural engineering).

Assuming that the structure displayed on the display screen 133 would actually be built, the digital representation of the structure would contain for one real-life part one or more digital representation (part). For example, for the one "touchable beam, three digital representations (pp4, ap4, A2$p$1).

Figure 2:
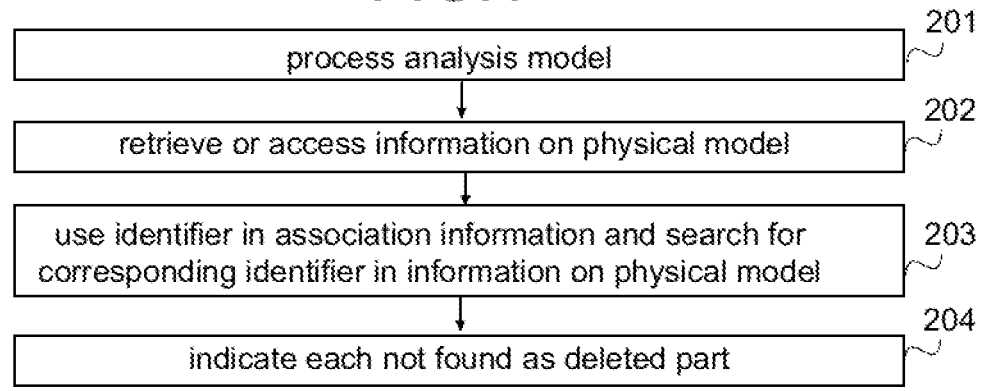
FIGS. 2 to 9 illustrate different examples of functionalities.

FIG. 2 illustrates an example of a functionality of a user apparatus running an analysis tool, and more precisely an example of a functionality of the physical part correspondence detection unit relating to the use of the association information. In the illustrated example it is assumed that an analysis model processed already has associations and that identifiers are used in the associations, without limiting the example to such a solution.

Referring to FIG. 2, the engineer is carrying out structural engineering. Therefore the analysis model is processed in step 201, and information on a physical BIM model is retrieved (downloaded) or accessed in step 202. Depending on an implementation, information on the physical BIM model may be retrieved/accessed together with the information on the analysis model, when the processing of the analysis model is started, and/or during processing in response to a user input requesting that the analysis model is brought, or checked whether it is, up-to-date with the physical BIM model, and/or upon the apparatus detecting that an updated (new) version of the physical BIM model has been stored, and/or as part of storing process of the analysis model and/or in response to some other event. In other words, it bears no significance which triggers the retrieval of/access to the information in step 202 and at what stage it is retrieved/accessed.

Then for each analysis part having association information (other than empty) following is performed: an identifier of a physical part in the association of the analysis part in the association information is used in step 203 to search for a corresponding identifier in the information on the physical BIM model, and if corresponding identifier is not found it means that a corresponding physical part has been deleted from the physical BIM model, and that is indicated to the user (engineer) in step 204. In other words, if the association information is identifiers of physical parts, the information on the physical BIM model is search for to find out whether the same identifiers are included in the information, and for each non-found identifier a corresponding analysis part, i.e. an analysis part having the non-found identifier as the association information, it is indicated that the physical part has been deleted. The indication may be using a different color and/or different type of line, when displaying the analysis part, or displaying an alert sign pointing to the analysis part, for example. It should be appreciated that the way how the indication is displayed (outputted) bears no significance and any suitable way may be used, as long as such parts are found and indicated.

Using the example of FIG. 1 and the first analysis model, association information pp1, pp2, pp3 and pp4 are used in the search, the result being that pp2 is not found, the analysis part having pp2 in the association information is apt, and therefore it is displayed using dashed lines.

The way the process then continues depends, for example, on the engineer's decision, structural engineering requirements and analysis results. For example, the engineer may simply delete the association, thereby making the analysis part a prospective part (part that may be a temporary or permanent support in future, for example), or delete the analysis part and perform other modifications, for example add temporary/permanent support structures, change characteristics of the analysis part (after deleting the association) and/or other analysis part, to fulfill the structural engineering and/or structural analysis requirements. Structural analysis is the main tool used by structural engineers to assure that a structure can withstand various types of forces that it will encounter during its normal operation. Analysis model and structural analysis of a structure are used to predict the behavior of the structure upon loads acting on the analysis parts. Therefore the analysis model needs to be in line (compliant enough) with the physical BIM model.

Figure 3:
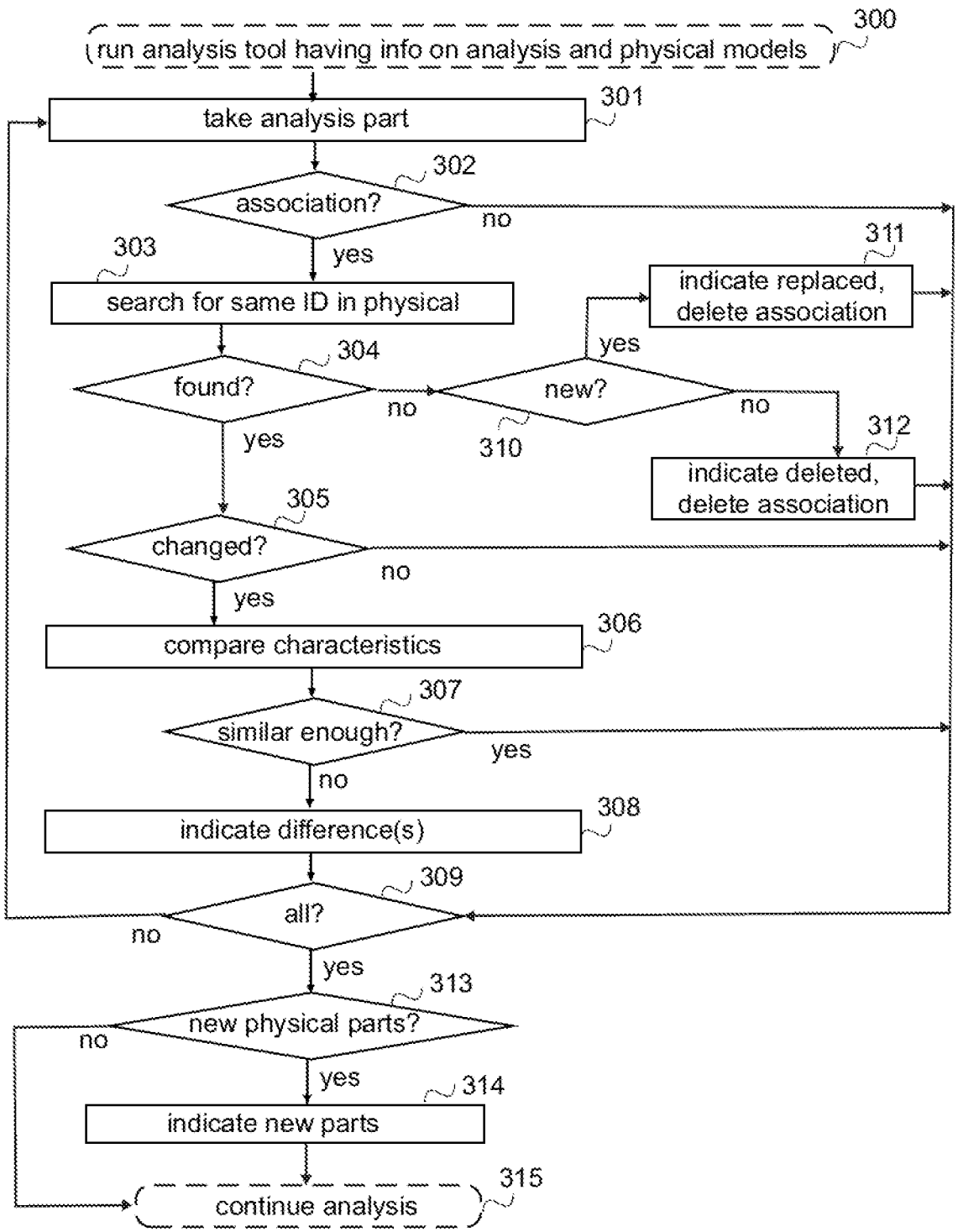

FIG. 3 illustrates another example of a functionality of a user apparatus running an analysis tool, and more precisely a further example of a functionality of the physical part correspondence detection unit relating to the use of the association information. In the illustrated example it is assumed, like in the example of FIG. 2, that an analysis model processed already has associations, and the associations uses IDs, without limiting the example to such a solution.

Referring to FIG. 3, the analysis tool is running in step 300 and have accessed/retrieved (downloaded) information on an analysis model currently being processed and information on a corresponding physical BIM model, and the up-to-date checking of the analysis model with the physical BIM model has been triggered, various possibilities being provided above with FIG. 2.

An analysis part in the analysis model is taken to be processed in step 301 and it is checked in step 302, whether the analysis part has an association. If it has (step 302: yes), the information on the physical BIM model is searched for in step 303 to find out whether the same ID that is in the association as an identifier of a physical part can be found also in the information on the physical BIM model. If the same ID is found (step 304: yes), it is checked, in step 305, using for example time information, whether the physical part has been changed after the previous up-to-date checking took place. If it has (step 305: yes), characteristics of the analysis part are compared in step 306 with corresponding characteristics of the physical part. The characteristics compared may be a subset of the characteristics of the analysis part, and may even depend on the type of the analysis part, or the same subset of the characteristics may be always used. For example, the subset of the characteristics used in the comparison (step 306) may include geometry definitions, location definitions and/or one or more material definitions. As part of the comparison it is checked in step 307, whether the characteristics are similar enough. For example, the characteristics of the analysis part may have a value (tolerance value) indicating an acceptable tolerance. The tolerance value may, for example, have been inputted by the engineer for the analysis part or group of analysis parts. The tolerance value may be a previously approved tolerance for a similar situation. A preset tolerance value, like 0.1% difference, may be used. Further, the analysis tool may have set a preset tolerance, based on local standards, for example. In other words, any way to provide the analysis tool with one or more tolerance values may be used. Since the analysis model is always an approximation, by using the tolerances, differences that in praxis have no impact, are not displayed, so that the engineer can concentrate on differences that need to be considered for the structural analysis. For example, a length difference of about 5 mm when the length is 6 m, or a small bolt hole can be ignored, whereas a big air vent cannot be ignored. For materials, an acceptable tolerance may be a better load bearing capability indicated by a definition of the physical part. Naturally a zero tolerance may be used, meaning that if the compared characteristics are not the same, they are not similar enough.

If the characteristics are not similar enough (step 307: no), the difference, or differences, are indicated in step 308 via a user interface to the engineer. For example, a neutral axis (center line) of the analysis part and a neutral axis of the physical part may be displayed, and the distance between them, for example using the 3D coordinate system, may be displayed. In another example, a difference in a material definition may be displayed by showing both definitions, for example "RSt 37-2" and "St 37-2" may be displayed side by side for a steel structure, the order of the displaying and/or colors used indicating which one of the definitions is the definition of the analysis part and which one the definition of the physical part. It should be appreciated that any way to indicate the difference (s) may be used. After indicating, (or if not immediately displayed, after marking to be indicated) the process proceeds to step 309 to check, whether all analysis parts in the analysis model have undergone the processing. If not (step 309: no), the process returns to step 301 and takes an analysis part that has not yet undergone the process to be processed.

If the compared characteristics are similar enough (step 307: yes), the process proceeds to step 309 to check, whether all analysis parts in the analysis model have undergone the processing.

If the physical part has not been changed after the previous up-to-date checking took place (step 305: no), the process proceeds to step 309 to check, whether all analysis parts in the analysis model have undergone the processing.

If the physical BIM model does not comprise the same ID (step 304: no), in the illustrated example it is checked in step 310, whether the physical BIM model contains a new physical part in the same location as the analysis part. For example, the earlier physical part may have been replaced by a new physical part, or deleted and later reintroduced causing the physical part to have a new ID. If there is a new physical part in the same location (step 310: yes), the physical part will be indicated in step 311 as replaced, for example using any way described above with step 204, and the association is deleted in step 311. Then the process proceeds to step 309 to check whether all analysis parts in the analysis model have undergone the processing.

If there is no new physical part (step 310: no) the physical part will be indicated in step 312 as deleted, for example as described above with step 204, and the association is deleted in step 312. In other words, a deletion of a physical part does not cause the corresponding analysis part to be deleted, only the association is deleted. Then the process proceeds to step 309 to check whether all analysis parts in the analysis model have undergone the processing.

If the analysis part does not have an association (step 302: no), the process proceeds to step 309 to check, whether all analysis parts in the analysis model have undergone the processing.

If all analysis parts in the analysis model have undergone the processing (step 309: yes), it is checked in step 313, whether the physical BIM model contains any new unprocessed physical parts. In other words, it is checked whether one or more physical parts not detected in step 310 have been added to a relevant part of the physical BIM model after the previous up-to-date checking. The relevant part depends on the analysis model. For example, the analysis model may be for a first floor in a west wing in a building, and hence the relevant part of the physical BIM model is the first floor in the west wing in the building. Using the example of FIG. 1, for the analysis model displayed, the relevant part of the physical model is the one defined by the columns and the beam.

If there is one or more such new physical parts (step 313: yes), each physical part is indicated in step 314 as a new part, for the engineer to consider whether to include a corresponding analysis part to the analysis model. Then the analysis continues (step 315) with the engineer being able to detect all changes, thanks to the indications, and considering how the changes affect the structural engineering and/or structural analysis. If there are indicated differences, the engineer notices them and can use his/her judgement to determine what should be performed as a next step. If the engineer provides a user input indicating that the difference is acceptable and requires no further measures, the accepted difference may be stored as a tolerance value to be used in the next up-to-date checking.

If there are no new parts (step 313: no), the analysis continues (step 315) as described above.

With the automatic indication of all changes, it is ensured that changes to the physical BIM model will be taken into account, resulting in a structure having the load-bearing capacity needed.

In another example, the checking of step 305 is not performed, but the comparison of characteristics is performed each time.

In one implementation it is possible to have an additional field whereto the engineer may add a reason why an analysis part is changed when the analysis continues (step 315). This information will be visible also in the physical BIM model so that the modeler can see it and can consider other alternatives. For example, using the example of FIG. 1, if the deletion of the middlemost column results in the characteristics of the analysis part representing the beam to change, for example the height to increase, the engineer may add to the additional field that change of height was caused by the deletion of the middlemost column in the physical BIM model. Then the modeler can see a reason, and can consider how to continue.

Figure 4:
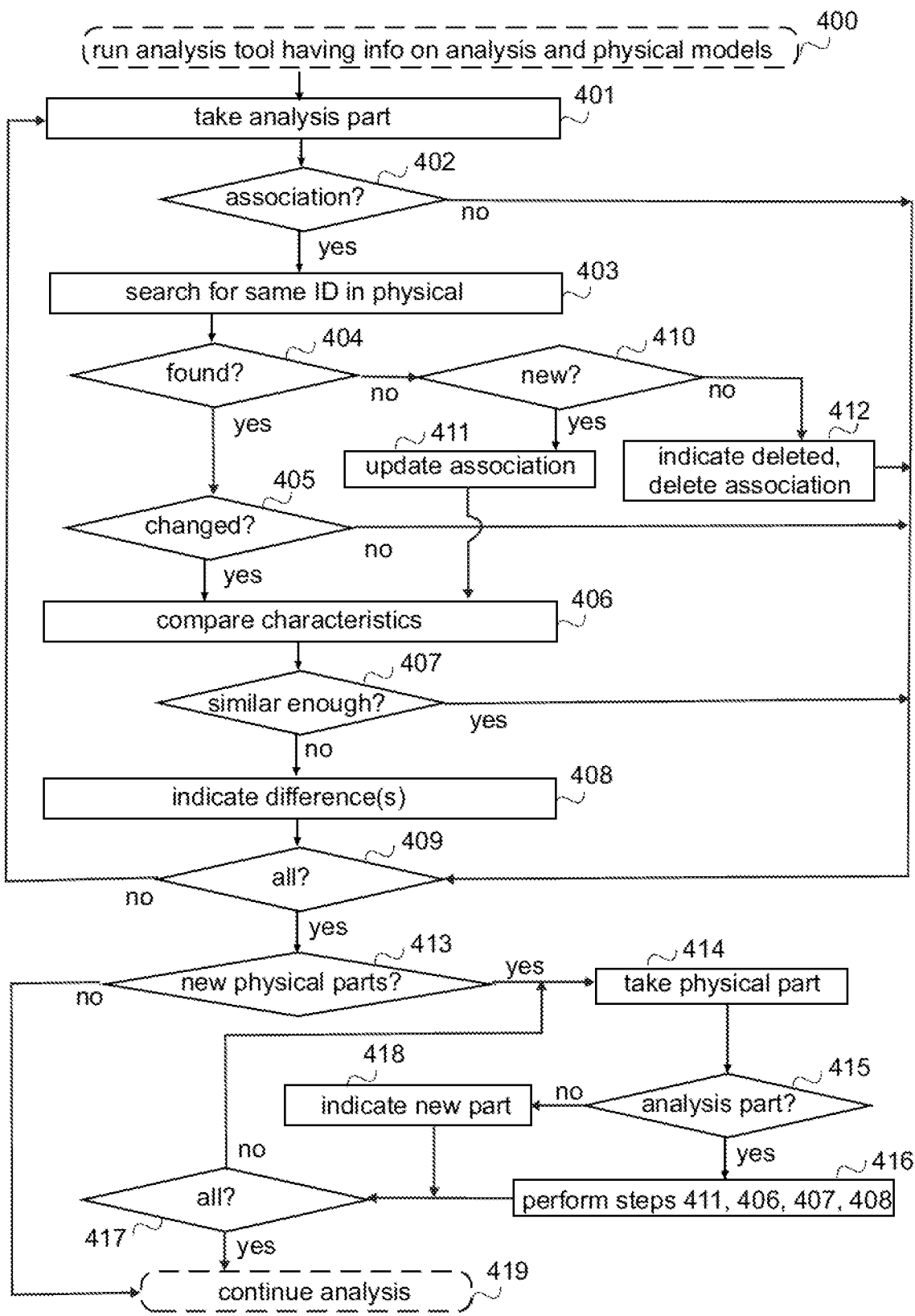

FIG. 4 illustrates a further example of a functionality of a user apparatus running an analysis tool, and more precisely a further example of a functionality of the physical part correspondence detection unit relating to the use of the association information. In the illustrated example it is assumed, like in the examples of FIGS. 2 and 3, that an analysis model processed already has associations, and the associations uses IDs, without limiting the example to such a solution.

The example illustrated in FIG. 4 illustrates a more automated functionality than the one illustrated in FIG. 3. In the more automated functionality, if certain criteria is fulfilled, an association will be created or updated automatically.

Referring to FIG. 4, steps 400 to 410 and step 412 correspond to steps 300 to 310 and step 312, and hence they are not repeated herein. If the physical BIM model does not comprise the same ID as is in the association (step 404: no), and the physical BIM model contains a new physical part in the same location as the analysis part (step 410: yes), the association is updated in step 411 to contain the ID of the new physical part (instead of the ID of the deleted part), and then the process proceeds to step 406 to compare the characteristic.

When all analysis parts in the analysis model have undergone the processing (step 409: yes), it is checked in step 413, in the same way as described above with step 312, whether the physical BIM model contains any new unprocessed physical parts.

If there is one or more such new physical parts (step 413: yes), such a physical part is taken in step 414 to be processed to find out in step 415, whether the analysis model comprises at the same location an analysis part. If there is at the same location an analysis part (step 415: yes), the analysis part undergoes in step 416 a process described above with step 411 (the association is updated to contain the ID of the physical part), step 406 (characteristics are compared), step 407 (are the analysis part and the physical part similar enough) and step 408 (if there are differences, they are indicated). Then the process continues to step 417 to check, whether all new physical parts found in step 413 are processed. If not (step 417: no), the process proceeds to step 414 to take an unprocessed new physical part to be processed.

If at the same location there is no analysis part (step 415: no), the physical part is (or will be) indicated in step 418 to the engineer as a new physical part. Then the process continues to step 417 to check, whether all new physical parts found in step 413 are processed.

If all new physical parts found in step 413 are processed (step 417: yes), or if no new physical parts are found in step 413 (step 413: no), the analysis continues (step 419) with the engineer being able to detect all changes, thanks to the indications, and considering how the changes affect the structural engineering. However, if a physical part has been replaced with a physical part having the same characteristics, the engineer is not indicated and no approval required.

In another example, the checking of step 405 is not performed, but the comparison of characteristics is performed each time.

In one implementation it is possible to have an additional field whereto the engineer may add a reason why an analysis part is changed when the analysis continues (step 419). As described above with FIG. 3, this information will be visible also in the physical BIM model so that the modeler can see it and can consider other alternatives.

It should be appreciated that instead of performing step 411, step 311 may be performed, or instead of performing steps 413 to 419, steps 313 to step 315 are performed.

Figure 5:
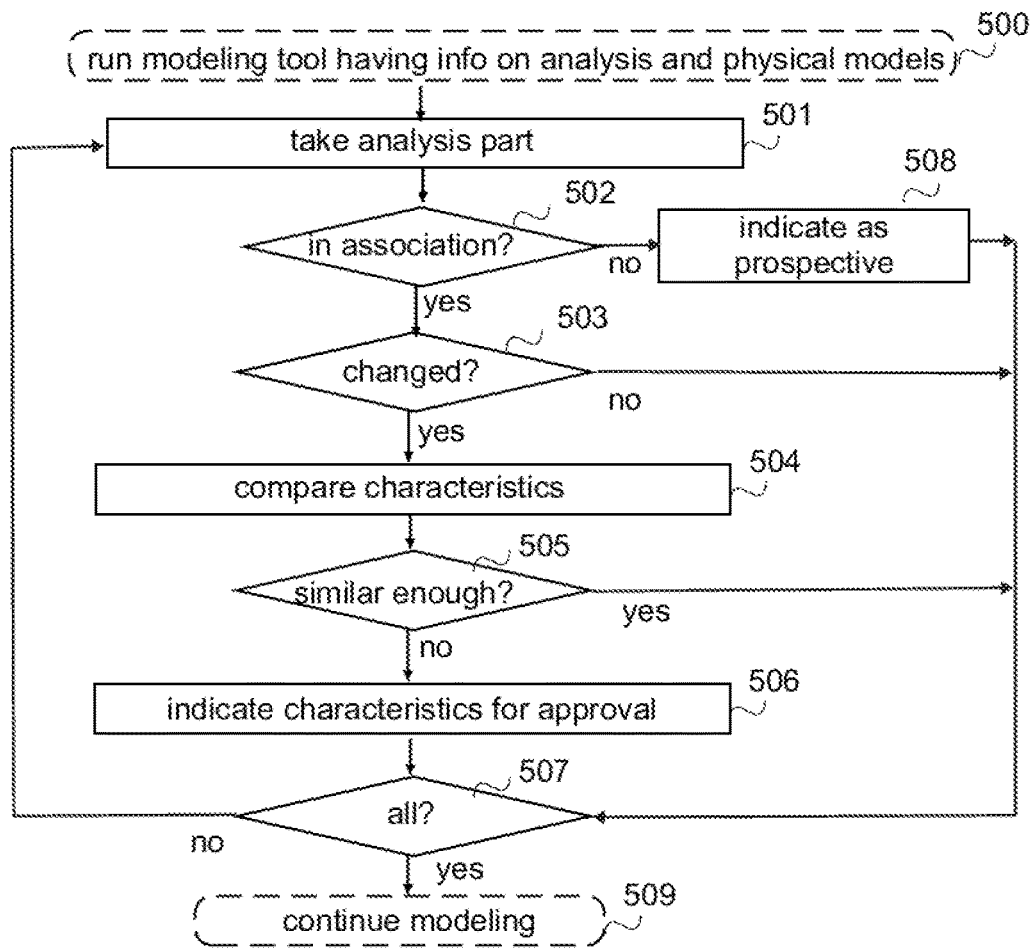

FIG. 5 illustrates an example of a functionality of a user apparatus running a modeling tool, and more precisely an example of a functionality of the analysis part correspondence detection unit relating to the use of the association information. In the illustrated example it is assumed that a physical BIM model processed already has associations, the associations are up-to-date, and the associations use IDs, without limiting the example to such a solution.

Referring to FIG. 5, the modeling tool is running in step 500 and has accessed/retrieved (downloaded) information on a physical BIM model (or part of the physical BIM model) currently being processed and information on one or more corresponding analysis models, and the up-to-date checking of the physical BIM model with the one or more analysis models has been triggered. Depending on an implementation this may happen when the processing of the physical BIM model is started, and/or during processing in response to a user input requesting that the physical BIM model is brought up-to-date, i.e. be in line, with the one or more analysis model, and/or upon the apparatus detecting that an updated (new) version of an analysis model has been stored, and/or as part of storing process of the physical BIM model and/or in response to some other event. In other words, it bears no significance which triggers the process.

An analysis part in one of the one or more analysis models is taken to be processed in step 501 and it is checked in step 502, whether the analysis part can be found in any of the associations in the association information. In the example in step 502 it is checked, whether the ID of the analysis part is found in the association information associated with a physical part. If the same ID is found (step 502: yes), it is checked, in step 503, using for example time information indicating whether the analysis part has been changed after the previous up-to-date checking took place. If it is has (step 503: yes), characteristics of the physical part having the association with the analysis part are compared in step 504 with corresponding characteristics of the analysis part. The characteristics compared may be a subset of the characteristics of the physical part, and may even depend on the type of the physical part, or the same subset of the characteristics may be always used. For example, the subset of the characteristics used in the comparison (step 504) may include geometry definitions, location definitions and one or more material definitions. As part of the comparison it is checked in step 505, whether the characteristics are similar enough. For example, the characteristics of the physical part may have a value (tolerance value) indicating an acceptable tolerance. (Different examples of tolerance values are given above with step 307.) Naturally a zero tolerance may be used, meaning that if the compared characteristics are not the same, they are not similar enough.

If the characteristics are not similar enough (step 505: no), the characteristics of the analysis part that are different from the characteristics of the physical part are indicated in step 506 via a user interface to the modeler for approval. Any way to indicate the difference(s) may be used. After indicating, (or if not immediately displayed, after marking to be indicated) the process proceeds to step 507 to check, whether all analysis parts in the one or more analysis models have undergone the processing. If not (step 507: no), the process returns to step 501 and takes an analysis part that has not yet undergone the process to be processed.

If the compared characteristics are similar enough (step 505: yes), the process proceeds to step 507 to check whether all analysis parts in the analysis model have undergone the processing.

If the analysis part has not been changed after the previous up-to-date checking took place (step 503: no), the process proceeds to step 507 to check whether all analysis parts in the analysis model have undergone the processing.

If the ID of the analysis part is not found in the association information (step 502: no), the analysis part is indicated, or will be indicated, in step 508 via the user interface to the modeler as a prospective part. In other words, it indicates that the engineer may be considering whether such a part should be added to the final model, or the engineer hints the modeler to add a corresponding physical part to the physical BIM model. Then the process proceeds to step 507 to check whether all analysis parts in the analysis model have undergone the processing. It should be appreciated that for each association having a physical part that does not any more exist in the physical BIM model, i.e. steps 503 and/or 504 cannot be performed, the analysis part is indicated or will be indicated as a prospective part.

If all analysis parts in the one or more analysis models have undergone the processing (step 507: yes), the modeling continues (step 509) with the modeler being able to detect all changes and prospective parts, thanks to the indications, and considering how the changes affect the modeling. If there are indicated differences, like change of size or material, the modeler notices them and can use his/her judgement to determine what should be performed as a next step, for example whether to approve them or not. For example, using the example of FIG. 1, if the deletion of the middlemost column by the modeler results in the characteristics of the analysis part representing the beam to change, for example the height to increase, this will be shown to the modeler who then can accept the increased height, or reject it (for example, because then height of the structure would exceed the maximum height given in building permission). If the modeler provides a user input indicating that the difference is acceptable and requires no further measures, the definitions of the physical part are updated to correspond to those of the analysis parts. Further, the accepted difference may be stored as a tolerance value to be used in the next up-to-date checking. In one implementation, if the modeler does not accept the difference, for example the changed size, the definitions of the physical part are not updated but the time information is updated, so that next time the engineer wants to bring the analysis model up-to-date with the physical BIM model, the engineer will be alerted. In one implementation it is possible to have an additional field whereto the modeler may add the reason why the change was not approved, for example that the physical part has already fabricated and therefore cannot be changed, and this information will be visible also in the analysis model so that the engineer can see it and can consider other alternatives.

It should be appreciated that in another implementation the modeler may select whether to indicate, for example, display, the prospective parts. In the implementation, if the selection is not to indicate the prospective parts, step 508 is skipped over.

Figure 6:
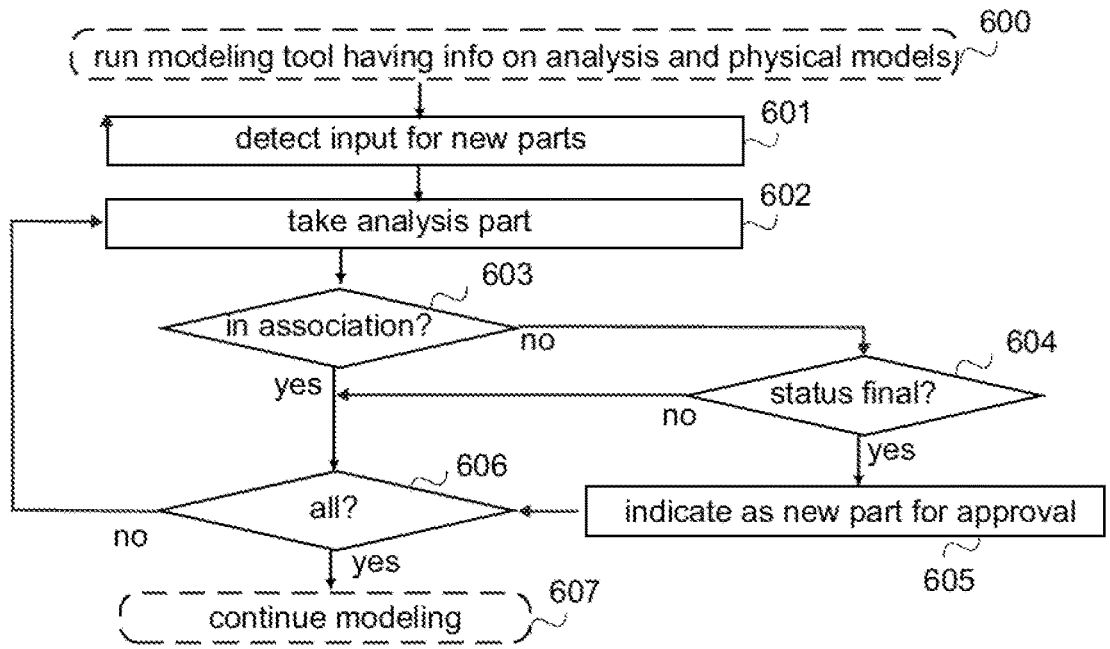

FIG. 6 illustrates another example of a functionality of a user apparatus running a modeling tool, and more precisely another example of a functionality of the analysis part correspondence detection unit relating to the use of the association information. In the illustrated example, as in the example of FIG. 5, it is assumed that a physical BIM model processed already has associations, the associations are up-to-date and the associations uses IDs, without limiting the example to such a solution.

Referring to FIG. 6, in the example it is illustrated that the modeling tool is running in step 600 and has accessed/retrieved (downloaded) information on a physical BIM model (or part of the physical BIM model) currently being processed and information on one or more corresponding analysis models. Then a user input requesting displaying new parts that should be added, according to the engineer, to the physical BIM model is detected in step 601. For example, the modeler may want to perform erection time calculations with all temporary support structures, or want to ensure that the engineer has not added any permanent support structure that violates the modeler's vision on the structure, for example a support column in the middle of an opening that should have no columns. Since, in the example, the information on the one or more corresponding analysis models is already available, an analysis part in one of the one or more analysis models is taken to be processed in step 602. Then it is checked in step 603, whether the analysis part can be found in any of the associations. In the example in step 603 it is checked, whether the ID of the analysis part is found in the association information.

If the ID of the analysis part is not found in the association information (step 603: no), its characteristics are used in step 604 to check, whether its status is final, i.e. the engineer has decided that it will not be changed. If the status is final (step 604: yes), the analysis part is indicated, or will be indicated, in step 605 via the user interface to the modeler as a new part for approval. Then the process proceeds to step 606 to check whether all analysis parts in the analysis model have undergone the processing. If not (step 606: no), the process returns to step 602 and takes an analysis part that has not yet undergone the process to be processed.

If the ID of the analysis part is found in the association information of the physical BIM model (step 603: yes), the process proceeds to step 606 to check whether all analysis parts in the analysis model have undergone the processing.

If the status is not final (step 604: no), the process proceeds to step 606 to check whether all analysis parts in the analysis model have undergone the processing.

If all analysis parts in the one or more analysis models have undergone the processing (step 606: yes), the modeling continues (step 607) with the modeler being able to see the final parts in the one or more analysis models that have no counterpart in the physical BIM model. For example, using the example in FIG. 1, at least the diagonal supports ap5, ap6 could be displayed. Then the modeler may approve them, or contact the engineer.

Naturally, if the information on the one or more corresponding analysis models is not available when the user input requesting displaying new parts is detected in step 601, the information will be retrieved/accessed.

Figure 7:
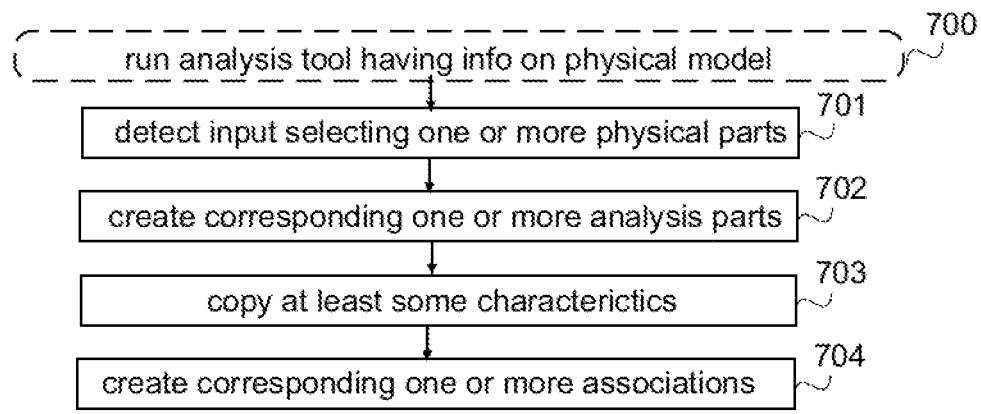

FIG. 7 illustrates a further example of a functionality of a user apparatus running an analysis tool, and more precisely a further example of a functionality of the physical part correspondence detection unit relating to the creation of the association information. In the illustrated example it is assumed that a physical BIM model exists, associations uses IDs and an analysis model is created based on the physical BIM model, without limiting the example to such a solution.

Referring to FIG. 7, the analysis tool is running in step 700 and have accessed/retrieved (downloaded) information on the physical BIM model, is displaying it, and the creation of an analysis model based on the physical BIM model has been triggered.

When a user input selecting one or more physical parts is detected in step 701 by the analysis tool, it creates corresponding one or more analysis parts in step 702. The creation comprises generating an identifier for each created analysis part. Then at least some of the characteristics of the selected one or more physical parts are copied in step 703 to be characteristics of corresponding one or more analysis parts. For example, location definitions, geometry definitions and material definitions of a physical part may be copied to the analysis model to be characteristics of the corresponding analysis part. Then corresponding one or more associations are created in step 704. If the associations are in the form of the pair, as in the example of FIG. 1, one or more associations are created, each association comprising an identifier of the analysis part and an identifier of the corresponding physical part. The steps are repeated until the creation of the analysis model ends.

It should be appreciated that also the modeling tool, and more precisely, the analysis part correspondence detection unit, may be configured to perform a functionality corresponding to the functionality described with FIG. 7 to create, based on an analysis model, corresponding one or more physical parts when one or more analysis parts are selected.

Figure 8:
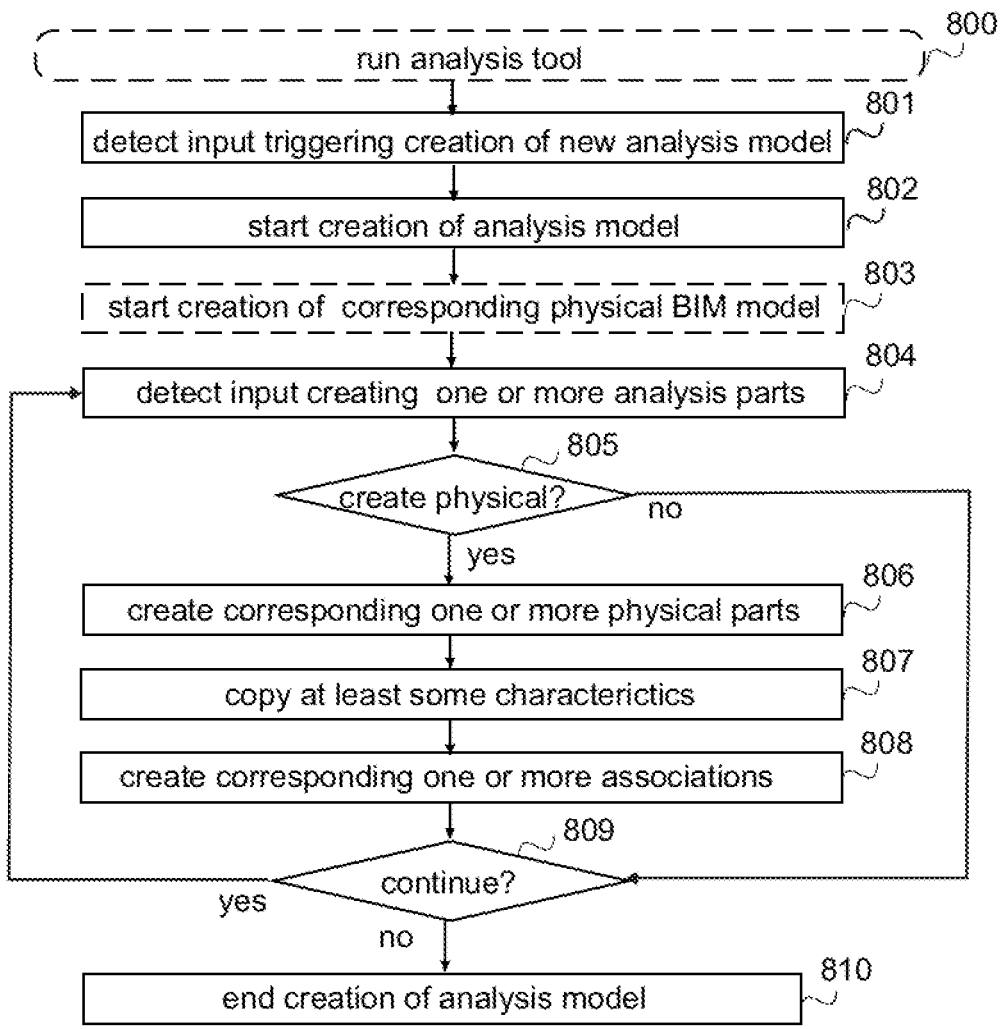

FIG. 8 illustrates a further example of a functionality of a user apparatus running an analysis tool, and more precisely a further example of a functionality of the physical part correspondence detection unit relating to the creation of the association information. In the illustrated example it is assumed that associations uses IDs, and if no models exists, a physical BIM model is created based on the analysis model.

Referring to FIG. 8, the analysis tool is running (step 800) and a user input triggering creation of a new analysis model is detected in step 801 by the analysis tool, the result being that the creation of the new analysis model is started in step 802. Starting of the creation may include storing name for the analysis model, etc.

Depending on an implementation, and whether a physical BIM model already exists, creation of a physical BIM model corresponding to the analysis model may be started in step 803. Starting of the creation may include storing name for the physical BIM model, etc. Starting may be based on part of information obtained from the engineer (user) in step 801, for example. The analysis tool may provide the engineer different options amongst which to select, for example. The options displayed to the engineer may be "this is for a physical BIM model "please add ID/indicate", "no physical BIM model exists", or "this is to a physical BIM model "please add ID, indicate" which does not yet model this volume". The last option could be for a situation in which the physical BIM model models west wing but not east wing, for example. It should be appreciated that the options are merely illustrative, and any other option may be displayed. Further, for example in an implementation in which the analysis tool and modeling tool are different features within the same application, step 803 is omitted since the information is inherent from the information the analysis tool already has, for example information given when the analysis tool us started.

When a user input creating one or more analysis parts is detected in step 804 by the analysis tool, it is checked in step 805, whether a corresponding physical part is to be created. The check may utilize a parameter value stored in the analysis tool, which parameter has as a default value "create corresponding physical part", and the user may any time during creation of a new analysis model to change the value to be the opposite. (Naturally the default value could be "do not create a corresponding physical part".) In another implementation, the latest user inputted value is used as the default value as long as the user does not change it. In further implementations, the user may be, each time when step 805 is entered, or as part of step 801 or 802, be prompted to provide the value.

If a corresponding physical part is to be created (step 805: yes) corresponding one or more physical parts are created in step 806. The creations in steps 802 and 806 comprise generating an identifier for each created analysis part and an identifier for each created physical part. At least some of the characteristics of the created one or more analysis parts are copied in step 807 to be characteristics of corresponding one or more physical parts. For example, location definitions, geometry definitions and material definitions of analysis part may be copied to the physical BIM model to be characteristics of the corresponding physical part. Then corresponding one or more associations are created in step 808. If the associations are in the form of the pair, as in the example of FIG. 1, one or more associations are created, each association comprising an identifier of the analysis part and an identifier of the corresponding physical part. If the creation of the model continues (step 809: yes), the process proceeds to step 804 to detect input creating one or more analysis part.

If no corresponding physical part is to be created (step 805: no), the process continues to step 809 to determine whether the modeling ends.

The steps 804 to 809 are repeated until it is detected (step 809: no) that the creation of the analysis model ends (step 810).

If a physical model exists depending on an implementation, the analysis model may be created using a combination of the processes described in FIGS. 7 and 8.

Figure 9:
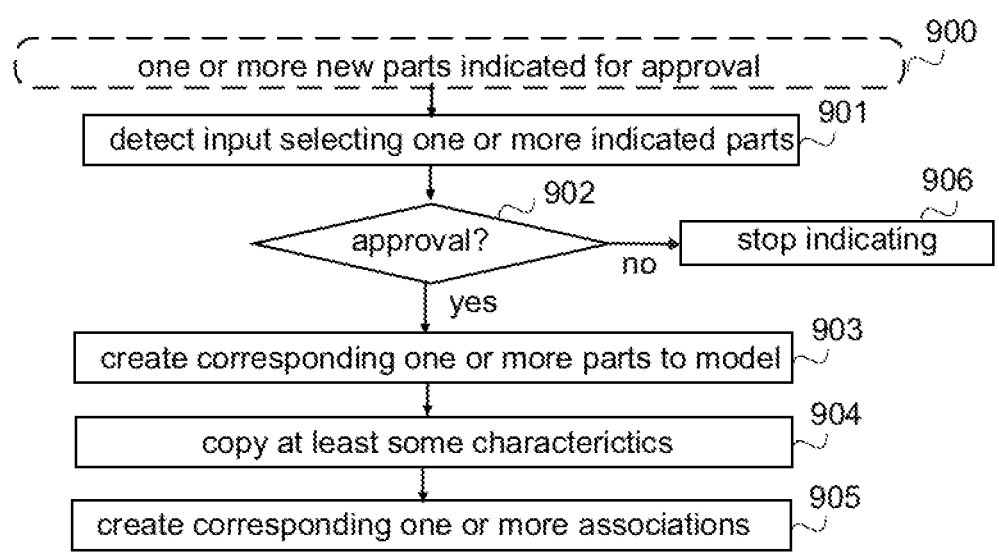

FIG. 9 illustrates a further example of a functionality to create associations. The functionality may be performed by a user apparatus running an analysis tool, more precisely the physical part correspondence detection unit, or by a user apparatus running a modeling tool, more precisely the analysis part correspondence detection unit.

Referring to FIG. 9, any of the processes in FIGS. 3 to 6 may have ended, resulting in one or more new parts being indicated for approval (step 900).

When a user input selecting one or more of the indicated parts is detected in step 901, it is checked in step 902, whether the user input is an approval. If it is (step 902: yes), corresponding one or more parts are created in step 903 to the model, the creation including generating for each created part an identifier. Then at least some of the characteristics of the selected one or more parts indicated as new parts are copied in step 904 to be characteristics of corresponding one or more parts created in step 903. For example, location definitions, geometry definitions and/or material definitions may be copied to be the characteristics. Then corresponding one or more associations are created in step 905. If the associations are in the form of the pair, as in the example of FIG. 1, one or more associations are created, each association comprising an identifier of an analysis part and an identifier of a physical part.

If the user input is not an approval (step 902: no), in the illustrated example the selected one or more parts are not any more indicated as new parts for approval, i.e. the indicating is stopped in step 906. The user may also input a reason of disapproval, as explained above.

The steps are repeated until all indicated are either approved or disapproved, or an input stopping the indication of new parts for approval is received.

A similar process may be used also to approve changed parts with steps 903 to 905 being combined to a step in which characteristics are updated.

As is evident from the above examples, the use of associations provides a mechanism for indicating that a part's A corresponding part $A^c$ in the other model has changed without changing the part A correspondingly. However, a possibility to change the part A correspondingly is provided. The association information enables that an analysis model and a physical BIM model can coexist as separate models, allowing multi-user modeling, and yet the models can be brought to be compliant enough with each other. Thanks to the logical model separation, and that analysis parts can exist without corresponding physical parts, the engineer can create alternative models for structural engineering calculations without affecting outputs generated from the physical BIM model, and afterwards the engineer can check the compliance, i.e. how well an analysis model and the physical BIM model fit together.

As a conclusion, association information in the analysis model assists the engineer in performing a technical task (structural engineering calculations to determine properties for pieces of a structure so that the structure can be fabricated and is safe after fabrication) by means of a guided human-machine interaction process provided by the indications. The same applies to association information in the physical BIM model; it assist a technical expert in performing different technical tasks, for example during fabrication scheduling or at a site, to ensure that temporary fabrication supports, for example, are included to the physical BIM model to be installed according to the engineer's plan in the analysis model, and/or at a right time in the site so that the fabrication process runs smoothly.

The steps and related functions described above in FIGS. 1 to 9 are in no absolute chronological order, and some of the steps may be performed simultaneously or in an order differing from the given one. Other functions can also be executed between the steps or within the steps. Some of the steps or part of the steps can also be left out or replaced by a corresponding step or part of the step. For example, when at least some characteristics are copied (step 703 or 807 or 904) additional characteristics may be inputted, either directly or indirectly, and stored.

The techniques described herein may be implemented by various means so that an apparatus implementing one or more functions/operations described above with an embodiment/example, for example by means of any of FIGS. 1 to 9 and any combination thereof, comprises not only prior art means, but also means for implementing the one or more functions/operations of a corresponding functionality described with an embodiment, for example by means of any of FIGS. 1 to 9 and any combination thereof, and it may comprise separate means for each separate function/operation, or means may be configured to perform two or more functions/operations. For example, one or more of the means and/or the physical part correspondence unit and/or the analysis part correspondence unit, or any corresponding unit/subunit(s)/integrated unit comprising at least both units, for one or more functions/operations described above may be software and/or software-hardware and/or hardware and/or firmware components (recorded indelibly on a medium such as read-only-memory or embodied in hard-wired computer circuitry) or combinations thereof. Software codes may be stored in any suitable, processor/computer-readable data storage medium(s) or memory unit(s) or article(s) of manufacture and executed by one or more processors/computers, hardware (one or more apparatuses), firmware (one or more apparatuses), software (one or more modules), or combinations thereof. For a firmware or software, implementation can be through modules (e.g., procedures, functions, and so on) that perform the functions described herein.

Figure 10:
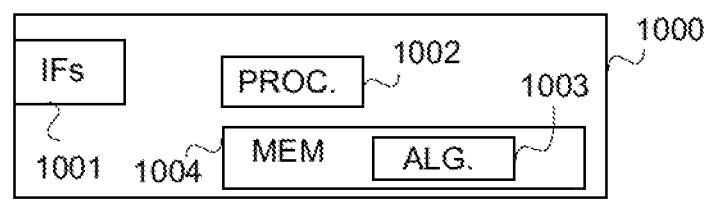
FIG. 10 is a schematic block diagram.

FIG. 10 is a simplified block diagram illustrating some units for an apparatus 1000 comprising the physical part correspondence unit and/or the analysis part correspondence unit, or any corresponding unit/subunit(s)/integrated unit comprising at least both units, or configured otherwise to perform at least some functionality described above, for example by means of any of FIGS. 1 to 9 and any combination thereof, or some of the functionalities if functionalities are distributed in the future. In the illustrated example, the apparatus comprises one or more interface (IF) entities 1001, such as one or more user interfaces and one or more communication interfaces, one or more processing entities 1002 connected to various interface entities 1001 and to one or more memories 1004.

The one or more interface entities 1001 are entities for receiving and transmitting information, such as communication interfaces comprising hardware and/or software for realizing communication connectivity according to one or more communication protocols, or for realizing data storing and fetching (obtaining, retrieving), or for providing user interaction via one or more user interfaces. The one or more user interfaces may be any kind of a user interface, for example a screen, a keypad, or an integrated display device or external display device.

A processing entity 1002 is capable to perform calculations and configured to implement at least the physical part correspondence unit and/or the analysis part correspondence unit, or any corresponding unit/subunit(s)/integrated unit comprising at least both units, described herein, or at least part of functionalities/operations described above, for example by means of any of FIGS. 1 to 9 and any combination thereof, as a corresponding unit or a sub-unit if distributed scenario is implemented, with corresponding algorithms 1003 stored in the memory 1004. The entity 1002 may include a processor, controller, control unit, microcontroller, unit, module, etc. suitable for carrying out embodiments or operations described above, for example by means of any of FIGS. 1 to 9 and any combination thereof. Generally the processor is a central processing unit, but the processor may be an additional operation processor.

A memory 1004 is usable for storing a computer program code required for the physical part correspondence unit and/or the analysis part correspondence unit, or any corresponding unit/subunit(s)/integrated unit comprising at least both units, or for one or more functionalities/operations described above, for example by means of any of FIGS. 1 to 9 and any combination thereof, i.e. the algorithms for implementing the functionality/operations described above by means of any of FIGS. 1 to 9 and any combination thereof. The memory 1004 may also be usable for storing other possible information, like technical documents.

The algorithms 1003 are software code, i.e. instructions, forming at least one portion of a computer program. The computer program may be in source code form, object code form, or in some intermediate form, and it may be stored in some sort of carrier, which may be any entity or device capable of carrying the program. For example, the computer program may be stored on a computer program distribution medium readable by a computing device or a processor. The computer program medium may be, for example but not limited to, an electrical carrier signal, software distribution package, or a non-transitory medium, for example. Coding of software for carrying out the embodiments as shown and described is well within the scope of a person of ordinary skill in the art.

As a summary, the physical part correspondence unit and/or the analysis part correspondence unit, or any corresponding unit/subunit(s)/integrated unit comprising at least both units and/or algorithms for functions/operations described herein, for example by means of means of any of FIGS. 1 to 9 and any combination thereof, may be configured as a computer or a processor, or a microprocessor, such as a single-chip computer element, or as a chipset, or one or more logic gates including at least a memory for providing storage area used for arithmetic operation and an operation processor for executing the arithmetic operation. The physical part correspondence unit and/or the analysis part correspondence unit, or any corresponding unit/subunit(s)/integrated unit comprising at least both units and/or algorithms for functions/operations described above, for example by means of means of any of FIGS. 1 to 9 and any combination thereof, may comprise one or more computer processors, application-specific integrated circuits (ASIC), digital signal processors (DSP), digital signal processing devices (DSPD), programmable logic devices (PLD), field-programmable gate arrays (FPGA), graphics processing units (GPU), and/or other hardware components that have been programmed and/or will be programmed by downloading computer program code (one or more algorithms) in such a way to carry out one or more functions of one or more embodiments/examples.

An embodiment provides a computer program embodied on any client-readable distribution/data storage medium or memory unit(s) or article(s) of manufacture, comprising program instructions executable by one or more processors/computers, which instructions, when loaded into an apparatus, constitute the physical part correspondence unit and/or the analysis part correspondence unit, or any corresponding unit/subunit(s)/integrated unit comprising at least both units or an entity providing corresponding functionality, or at least part of the corresponding functionality. Programs, also called program products, including software routines, program snippets constituting "program libraries", applets and macros, can be stored in any medium and may be downloaded into an apparatus. In other words, each or some or one of the units/sub-units and/or the algorithms for one or more functions/operations described above, for example by means of means of any of FIGS. 1 to 9 and any combination thereof, may be an element that comprises one or more arithmetic logic units, a number of special registers and control circuits.

It will be obvious to a person skilled in the art that, as the technology advances, the inventive concept can be implemented in various ways. The invention and its embodiments are not limited to the examples described above but may vary within the scope of the claims.

The invention claimed is:

1. A computer implemented method comprising:
    providing a first computer system having a first display and being operated by a first user, wherein the first user is a user of a modeling tool;
    providing a second computer system having a second display and being operated by a second user, wherein the second user is a user of an analysis tool;
    processing, by the analysis tool running on the second computer system, an analysis model for structural engineering for a structure, the analysis model comprising a plurality of analysis parts to model corresponding pieces of the structure, the analysis tool having access to a physical building information modeling (BIM) model of the structure, the physical BIM model comprising a plurality of physical parts to model corresponding pieces of the structure, wherein the analysis model comprises or has access to association information including a set of identifiers for the plurality of analysis parts and the plurality of physical parts, wherein the set of identifiers indicate whether or not an analysis part is associated with a physical part;

receiving, at the first computer system, an instruction to remove a first physical part from the physical BIM model;

using, by the analysis tool running on the second computer system, an identifier of the first physical part from the set of identifiers in the association information to search for a corresponding identifier of the first physical part in the physical BIM model;

in response to detecting that the corresponding identifier of the first physical part is not found in the physical BIM model, deleting, by the analysis tool running on the second computer system, without user input the identifier of the first physical part from the association information;

displaying, at the second display of the second computer system, an indication that the first physical part has been deleted from the physical BIM model based on the deletion of the identifier of the first physical part from the association information;

determining, by the analysis tool running on the second computer system, for a second physical part whose identifier is not in the association information, whether there is an analysis part having similar location definitions; and in response to identifying the analysis part having similar location definitions, associating, by the analysis tool running on the second computer system, the second physical part with the analysis part by adding the identifier of the second physical part to the association information, or indicating that there is a new physical part having a counterpart in the analysis model.

2. A computer implemented method as claimed in claim 1, further comprising, in response to detecting that a corresponding identifier of a third physical part is found in the physical BIM model:

comparing characteristics of a third analysis part with characteristics of the third physical part; and if the characteristics of the third analysis part and the characteristics of the third physical part are different, indicating to the second user a change or a difference.

3. A computer implemented method as claimed in 2, further comprising, prior to indicating the change or the difference:

comparing the difference with a tolerance, and indicating the change or the difference only in response to the difference exceeding the tolerance.

4. A computer implemented method as claimed in claim 2, further comprising, prior to performing the comparing of the characteristics:

using time information to determine whether the third physical part is newer than the third analysis part; and performing the comparing of the characteristics in response to the third physical part being newer than the third analysis part.

5. A computer implemented method as claimed in claim 2, wherein the compared characteristics include location definitions, geometry definitions, or material definitions.

6. An apparatus comprising at least one processor and at least one memory including computer program code, the at least one memory and the computer program code being configured to, with the at least one processor, implement the method as claimed in claim 1.

7. A system comprising:

at least one data storage configured to store at least one digital model, a digital model comprising at least one physical building information modeling (BIM) model of a structure, at least one analysis model for structural engineering for the structure, and association information, the physical BIM model comprising a plurality of physical parts to model corresponding pieces of the structure, the analysis model comprising a plurality of analysis parts to model corresponding pieces of the structure, the association information comprising associations between analysis parts of the structure and physical parts of the structure, wherein an identifier of a physical part associated in the association information with an identifier of an analysis part indicates that the parts are associated with each other; and one or more apparatuses as claimed in claim 6, the one or more apparatuses being further configured to have access to at least one of the at least one data storage for retrieving and for storing digital model information.

8. A computer program product comprising program instructions which, when the program is executed by a computing device, cause the computing device to carry out the method as claimed in claim 1.

9. A non-transitory computer-readable storage medium storing one or more instructions which, when executed by one or more processors, cause an apparatus to carry out the method as claimed in claim 1.

* * * * *